(12) United States Patent
Lee et al.

(10) Patent No.: US 11,630,355 B2
(45) Date of Patent: Apr. 18, 2023

(54) PRINTED CIRCUIT BOARD AND DISPLAY DEVICE INCLUDING THE SAME

(71) Applicant: LG Display Co., Ltd., Seoul (KR)

(72) Inventors: Jeong-Kyu Lee, Seongnam-si (KR); Dong-Won Park, Goyang-si (KR); Min-Gyu Park, Seoul (KR); Nam-Kon Ko, Seoul (KR)

(73) Assignee: LG Display Co., Ltd., Seoul (KR)

( * ) Notice: Subject to any disclaimer, the term of this patent is extended or adjusted under 35 U.S.C. 154(b) by 123 days.

(21) Appl. No.: 17/111,134

(22) Filed: Dec. 3, 2020

(65) Prior Publication Data

US 2021/0173248 A1   Jun. 10, 2021

(30) Foreign Application Priority Data

Dec. 10, 2019   (KR) .......................... 10-2019-0163666

(51) Int. Cl.
| | | |
|---|---|---|
| H05K 1/02 | (2006.01) |
| G02F 1/1345 | (2006.01) |
| H05K 1/14 | (2006.01) |
| H05K 1/11 | (2006.01) |

(52) U.S. Cl.
CPC ....... *G02F 1/13452* (2013.01); *H05K 1/0201* (2013.01); *H05K 1/111* (2013.01); *H05K 1/147* (2013.01); *H05K 2201/10136* (2013.01)

(58) Field of Classification Search
CPC ...... H05K 1/0201; H05K 1/111; H05K 1/147; H05K 2201/10136
USPC ......................................................... 361/760
See application file for complete search history.

(56) References Cited

U.S. PATENT DOCUMENTS

| | | | | |
|---|---|---|---|---|
| 6,239,484 B1* | 5/2001 | Dore | ..................... | H01L 21/563 |
| | | | | 257/687 |
| 6,929,975 B2* | 8/2005 | Heinz | .................. | H05K 1/0206 |
| | | | | 438/106 |
| 8,228,682 B1* | 7/2012 | Zohni | .................... | H01G 2/065 |
| | | | | 361/782 |
| 9,001,518 B2* | 4/2015 | Hauenstein | .......... | H01R 12/778 |
| | | | | 361/760 |
| 9,474,166 B2* | 10/2016 | Nakazawa | ........... | H05K 3/3452 |
| 9,902,006 B2* | 2/2018 | Vuono | ................. | B23K 1/0016 |
| 2002/0050380 A1* | 5/2002 | Tanimura | ............... | H05K 3/341 |
| | | | | 174/522 |

(Continued)

FOREIGN PATENT DOCUMENTS

| | | |
|---|---|---|
| KR | 10-1018231 B1 | 2/2011 |
| KR | 10-2014-0115750 A | 10/2014 |

(Continued)

*Primary Examiner* — Hoa C Nguyen
(74) *Attorney, Agent, or Firm* — Seed IP Law Group LLP

(57) ABSTRACT

A display device is disclosed. The display device includes a display panel configured to display an image, and a printed circuit board electrically connected to the display panel and disposed at a back surface of the display panel. The printed circuit board includes an insulating layer, a first metal layer disposed at one surface of the insulating layer, pads including a first pad disposed on the first metal layer while being disposed inside a mounting area where an integrated circuit is mounted, and second pads disposed around the first pad, and a groove provided to extend from an inside of the mounting area to an outside of the mounting area.

16 Claims, 17 Drawing Sheets

(56) References Cited

U.S. PATENT DOCUMENTS

| | | | |
|---|---|---|---|
| 2007/0045804 A1* | 3/2007 | Lin .................... | H05K 1/0207 |
| | | | 257/686 |
| 2013/0010432 A1* | 1/2013 | Sundstrom .......... | H05K 1/0207 |
| | | | 361/748 |
| 2017/0179059 A1* | 6/2017 | Yao ....................... | H01L 24/03 |
| 2020/0211927 A1* | 7/2020 | Wan .................... | H01L 21/4882 |

FOREIGN PATENT DOCUMENTS

| | | |
|---|---|---|
| KR | 10-1535447 B1 | 7/2015 |
| KR | 10-2019-0021782 A | 3/2019 |

* cited by examiner

PRINTED CIRCUIT BOARD AND DISPLAY DEVICE INCLUDING THE SAME

CROSS-REFERENCE TO RELATED APPLICATION(S)

This application claims the benefit of Korean Patent Application No. 10-2019-0163666 filed on Dec. 10, 2019, which is hereby incorporated by reference as if fully set forth herein.

BACKGROUND

Technical Field

The present disclosure relates to a printed circuit board and a display device including the same.

Description of the Related Art

In accordance with advances in information technology, the market for display devices as a connection medium between a user and information is expanding. Accordingly, use of display devices such as an organic light emitting display (OLED) device, a quantum dot display (QDD) device, a liquid crystal display (LCD) device, and a plasma display panel (PDP) is increasing.

A part of the above-mentioned display devices, for example, the LCD device or the OLED device, includes a display panel including a plurality of sub-pixels disposed in a matrix, a driver for outputting a drive signal to drive the display panel, and a power supply for generating electric power to be supplied to the display panel or the driver. The driver includes a scan driver for supplying a scan signal (or a gate signal) to the display panel, a data driver for supplying a data signal to the display panel, etc.

When drive signals, for example, a scan signal and a data signal, are supplied to the sub-pixels formed at the display panel in the display device as mentioned above, selected ones of the sub-pixels transmit light therethrough or directly emit light and, as such, an image may be displayed.

BRIEF SUMMARY

Accordingly, the present disclosure is directed to a printed circuit board and a display device including the same that substantially obviate one or more problems due to limitations and disadvantages of the related art.

Embodiments of the present disclosure provide a printed circuit board and a display device including the same, which are capable of not only dispersing and guiding heat generated from an integrated circuit (IC) to an outside or surroundings of the IC by providing a heat dissipation route assisting in dispersing the heat to several areas without local concentration thereof (guiding heat generated from the IC to an area spaced apart from the IC by a certain distance or more), but also achieving an enhancement in driving stability of a driving device or an organic light emitting display (OLED) device and an enhancement in display quality.

Additional advantages, technical benefits, and features of the present disclosure will be set forth in part in the description which follows and in part will become apparent to those having ordinary skill in the art upon examination of the following or may be learned from practice of the present disclosure. Other advantages of the present disclosure may be realized and attained by the structure particularly pointed out in the written description and claims hereof as well as the appended drawings.

To achieve these technical benefits and other advantages and in accordance with the purpose of the present disclosure, as embodied and broadly described herein, a display device includes a display panel configured to display an image, and a printed circuit board electrically connected to the display panel and disposed at a back surface of the display panel, wherein the printed circuit board includes an insulating layer, a first metal layer disposed at one surface of the insulating layer, pads including a first pad disposed on the first metal layer while being disposed inside a mounting area where an integrated circuit is mounted, and second pads disposed around the first pad, and a heat insulating structure, such as a an open groove or groove filled with a heat insulating material is provided to extend from an inside of the mounting area to an outside of the mounting area. The groove may extend to be adjacent to the four sides of the first pad, and may then extend from a corner portion of the first pad to the outside of the mounting area along at least two lines spaced apart from each other.

The at least two lines may include at least one area where the groove is disconnected at the outside of the mounting area after extending linearly lengthily along the at least two lines in a longitudinal direction of the printed circuit board.

The at least two lines may meet with each other at the outside of the mounting area after extending linearly lengthily in a longitudinal direction of the printed circuit board.

The display device may further include a heat dissipation plate disposed on the first metal layer. The heat dissipation plate may be disposed in a space provided by the at least two lines.

The groove may include a plurality of first grooves respectively located adjacent to corresponding ones of the second pads disposed at four sides of the first pad, and a second groove adjacent to the plurality of first grooves at the outside of the mounting area.

The groove may include a first groove adjacent to the four sides of the first pad, and a second groove disposed outside the mounting area. The printed circuit board may further include a second metal layer disposed at the other surface of the insulating layer and separated in the form of islands corresponding to respective positions of the first and second grooves. The first groove and the second groove may include a first via hole and a second via hole, respectively, to electrically connect the first metal layer and the second metal layer.

The second groove may have a U shape opened at a side thereof opposite to the first groove.

In another aspect of the present disclosure, a printed circuit board includes an insulating layer, a first metal layer disposed at one surface of the insulating layer, pads including a first pad disposed on the first metal layer while being disposed inside a mounting area where an integrated circuit is mounted, and second pads disposed around the first pad, and a groove provided to extend from an inside of the mounting area to an outside of the mounting area.

The groove may extend to be adjacent to the four sides of the first pad, and may then extend from a corner portion of the first pad to the outside of the mounting area along at least two lines spaced apart from each other.

The present disclosure may provide a printed circuit board capable of dispersing and guiding heat generated from an integrated circuit (IC) to an outside or surroundings of the IC by providing a heat dissipation route assisting in dispersing the heat to several areas without local concentration thereof (guiding heat generated from the IC to an area spaced apart from the IC by a certain distance or more). In addition, the present disclosure may achieve an enhancement in driving stability of a driving device or an organic light emitting device (OLED) device and an enhancement in display quality through prevention of a phenomenon in which heat is concentrated in an IC mounting area of the printed circuit board.

It is to be understood that both the foregoing general description and the following detailed description of the present disclosure are explanatory and are intended to provide further explanation of the present disclosure as claimed.

BRIEF DESCRIPTION OF THE SEVERAL VIEWS OF THE DRAWINGS

The accompanying drawings, which are included to provide a further understanding of the present disclosure and are incorporated in and constitute a part of this application, illustrate embodiment(s) of the present disclosure and along with the description serve to explain the principle of the present disclosure. In the drawings.

DETAILED DESCRIPTION

In accordance with advances in information technology, the market for display devices as a connection medium between a user and information is expanding. Accordingly, use of display devices such as an organic light emitting display (OLED) device, a quantum dot display (QDD) device, a liquid crystal display (LCD) device, and a plasma display panel (PDP) is increasing.

A part of the above-mentioned display devices, for example, the LCD device or the OLED device, includes a display panel including a plurality of sub-pixels disposed in a matrix, a driver for outputting a drive signal to drive the display panel, and a power supply for generating electric power to be supplied to the display panel or the driver. The driver includes a scan driver for supplying a scan signal (or a gate signal) to the display panel, a data driver for supplying a data signal to the display panel, etc.

When drive signals, for example, a scan signal and a data signal, are supplied to the sub-pixels formed at the display panel in the display device as mentioned above, selected ones of the sub-pixels transmit light therethrough or directly emit light and, as such, an image may be displayed. Hereinafter, description of the present disclosure will be continued in conjunction with examples of an LCD device and an OLED device. Meanwhile, the present disclosure, which will be described below, may also be applied to a display device based on inorganic light emitting diodes other than organic light emitting diodes.

Figure 1:
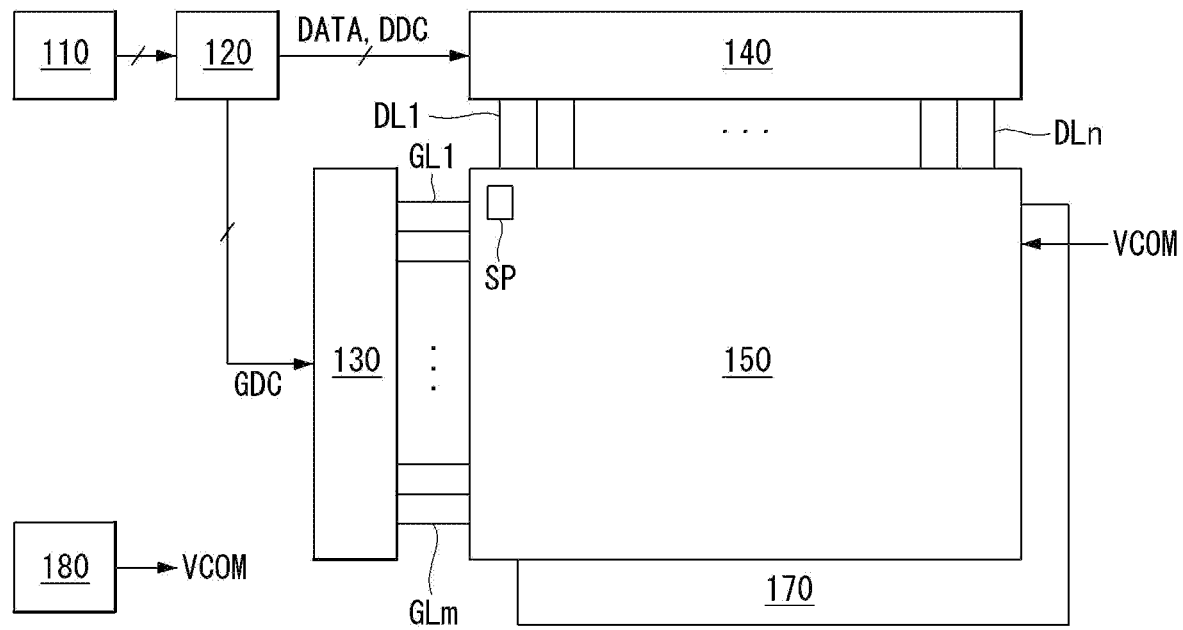
FIG. 1 is a block diagram schematically illustrating a light emitting display (LCD) device.
Figure 2:
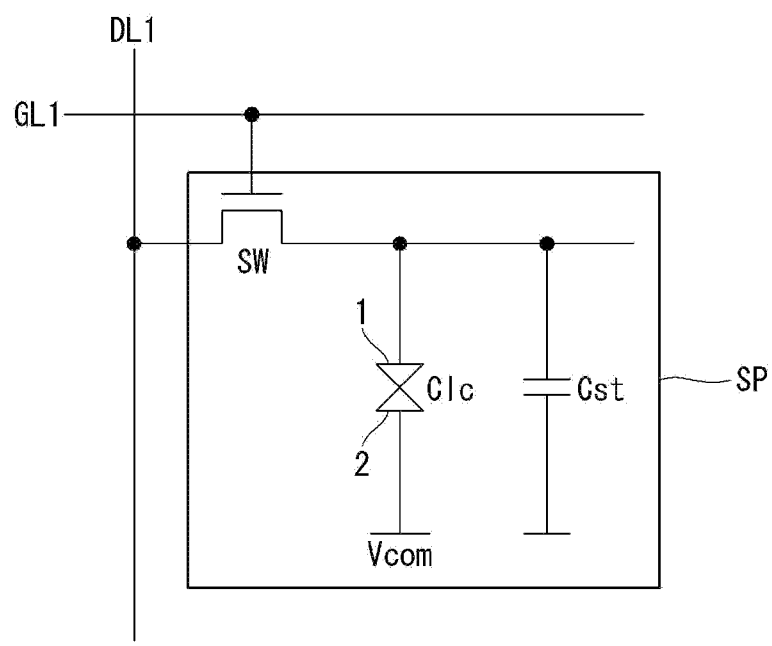
FIG. 2 is a circuit diagram schematically illustrating a sub-pixel shown in FIG. 1.

FIG. 1 is a block diagram schematically illustrating an LCD device. FIG. 2 is a circuit diagram schematically illustrating a sub-pixel shown in FIG. 1.

As illustrated in FIGS. 1 and 2, the LCD device includes an image supply 110, a timing controller 120, a scan driver 130, a data driver 140, a liquid crystal panel 150, a backlight unit 170, a power supply 180, etc.

The image supply 110 outputs various drive signals as well as an image data signal supplied from an outside of the device or an image data signal stored in an internal memory. The image supply 110 supplies the data signal and the various drive signals to the timing controller 120.

The timing controller 120 outputs a gate timing control signal GDC for controlling operation timing of the scan driver 130, a data timing control signal DDC for controlling operation timing of the data driver 140, various synchronization signals (a vertical synchronization signal Vsync and a horizontal synchronization signal Hsync), etc. The timing controller 120 supplies a data signal (or a data voltage) DATA supplied from the image supply (image processor) 110 to the data driver 140, together with the data timing control signal DDC.

The scan driver 130 outputs a scan signal (or a gate signal) in response to the gate timing control signal GDC supplied from the timing controller 120, etc. The scan driver 130 supplies a scan signal to sub-pixels included in the liquid crystal panel 150 through gate lines GL1 to GLm. The scan driver 130 is formed in the form of an integrated circuit (IC) or may be directly formed on the liquid crystal panel 150 in a gate-in-panel (GIP) manner.

The data driver 140 samples and latches the data signal DATA in response to the data timing control signal DDC supplied from the timing controller 120, etc. The data driver 140 converts the sampled and latched data signal into a data voltage having the form of an analog signal corresponding to a gamma reference voltage, and outputs the data voltage. The data driver 140 supplies the data voltage to the sub-pixels included in the liquid crystal panel 150 through data lines DL1 to DLn. The data driver 140 may take the form of an IC, and may be mounted on the display panel 150 or may be mounted on a printed circuit board without being limited thereto.

The power supply 180 generates and outputs a common voltage VCOM based on an external input voltage supplied from outside the device. The power supply 180 may generate and output voltages (for example, a scan-high voltage and a scan-low voltage) required for driving the scan driver 130, voltages (for example, a drain voltage and a half-drain voltage) required to drive the data driver 140, etc., as well as the common voltage VCOM.

The liquid crystal panel 150 displays an image in accordance with the scan signal supplied from the scan driver 130, the data voltage supplied from the data driver 140, and the common voltage VCOM supplied from the power supply 180. The sub-pixels of the liquid crystal panel 150 controls light supplied through the backlight unit 170.

For example, each sub-pixel SP includes a switching transistor SW, a storage capacitor Cst, and a liquid crystal layer Clc. The switching transistor SW is connected, at a gate thereof, to a scan line GL1 while being connected, at a source thereof, to a data line DL1. The storage capacitor Cst is connected, at one end thereof, to a drain of the switching transistor SW while being connected, at the other end thereof, to a common voltage line Vcom. The liquid crystal layer Clc is formed between a pixel electrode 1 connected to the drain of the switching transistor SW and a common electrode 2 connected to the common voltage line Vcom.

The liquid crystal panel 150 may be embodied as a twisted nematic (TN) mode, a vertical alignment (VA) mode, an in-plane switching (IPS) mode, a fringe field switching (FFS) mode, or an electrically controlled birefringence (ECB) mode in accordance with structures of the pixel electrode 1 and the common electrode 2.

The backlight unit 170 provides light to the liquid crystal panel 150 using a light source for emitting light, etc. The backlight unit 170 includes a light emitting diode (hereinafter referred to as an "LED"), an LED driver for driving the LED, an LED substrate on which the LED is mounted, a light guide plate for converting light emitted from the LED into area light, a reflection plate for reflecting light beneath the light guide plate, and optical sheets for concentrating and diffusing light emitted from the light guide plate. Of course, the backlight unit 170 is not limited to the above-described configuration.

Figure 3:
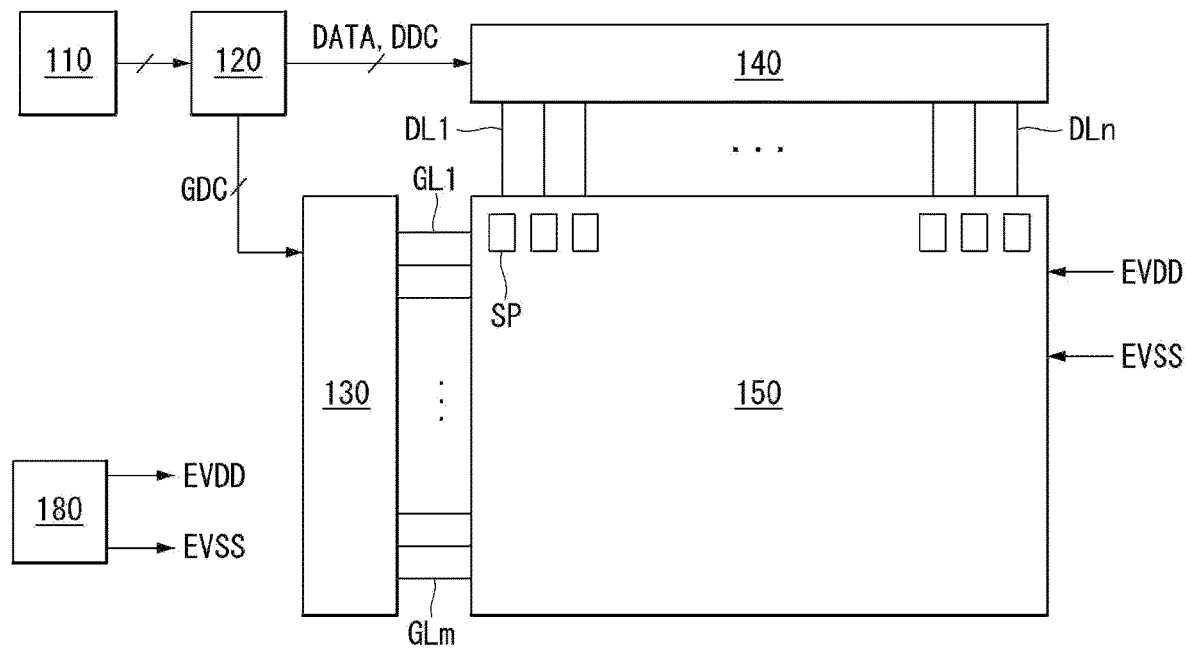
FIG. 3 is a block diagram schematically illustrating an organic electroluminescent display device.
Figure 4:
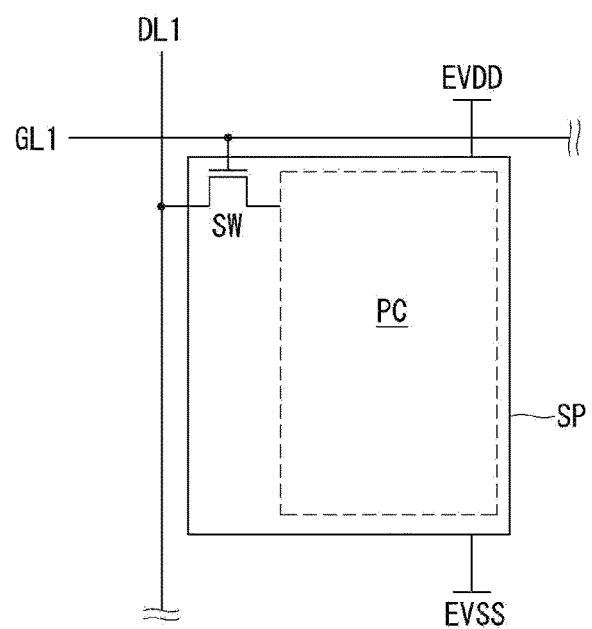
FIG. 4 is a circuit diagram schematically illustrating a sub-pixel shown in FIG. 3.

FIG. 3 is a block diagram schematically illustrating an organic electroluminescent display device. FIG. 4 is a circuit diagram schematically illustrating a sub-pixel shown in FIG. 3.

As illustrated in FIGS. 3 and 4, the organic electroluminescent display device includes an image supply 110, a timing controller 120, a scan driver 130, a data driver 140, a display panel 150, a power supply 170, etc.

The image supply 110, the timing controller 120, the scan driver 130, the data driver 140, etc., included in the organic electroluminescent display device are similar to those of the LCD device of FIG. 1 in terms of basic configurations and operations and, as such, no detailed description thereof will be given. In place, the power supply 180 and the display panel 150, which are considerably distinguished from those of the LCD device, will be described in more detail.

The power supply 180 generates and outputs a first drive voltage EVDD having a high level and a second drive voltage EVSS having a low level based on an external input voltage supplied from an outside of the device. The power supply 180 may generate and output voltages required for driving of the scan driver 130 (for example, a scan-high voltage and a scan-low voltage), voltages required for driving of the data driver 140 (for example, a drain voltage and a half-drain voltage), etc., as well as the first and second drive voltages EVDD and EVSS.

The display panel 150 displays an image in accordance with a drive signal output from a driver including the scan driver 130 and the data driver 140 (the drive signal including a scan signal and a data voltage), and the first and second drive voltages EVDD and EVSS output from the power supply 180. Sub-pixels of the display panel 150 directly emit light.

For example, each sub-pixel SP includes a pixel circuit PC including a switching transistor SW, a driving transistor, a storage capacitor, an OLED, etc. The sub-pixel SP used in the organic electroluminescent display device directly emits light and, as such, has a complex circuit configuration, as compared to that of the LCD device. Furthermore, the configuration of a compensation circuit for compensating for degradation of the driving transistor supplying drive current to the OLED or degradation of other elements is complex and diverse. In this regard, the pixel circuit PC included in the sub-pixel PC is simply shown in the form of a block.

Figure 5:
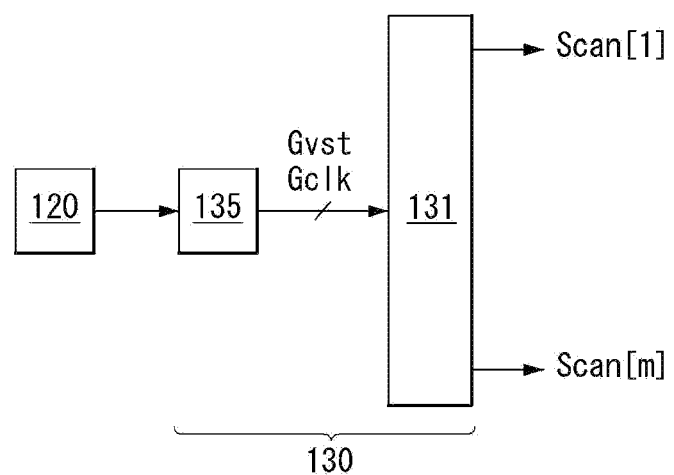
FIG. 5 is a block diagram illustrating a configuration of a device associated with a gate-in panel type scan driver.
Figure 6A:
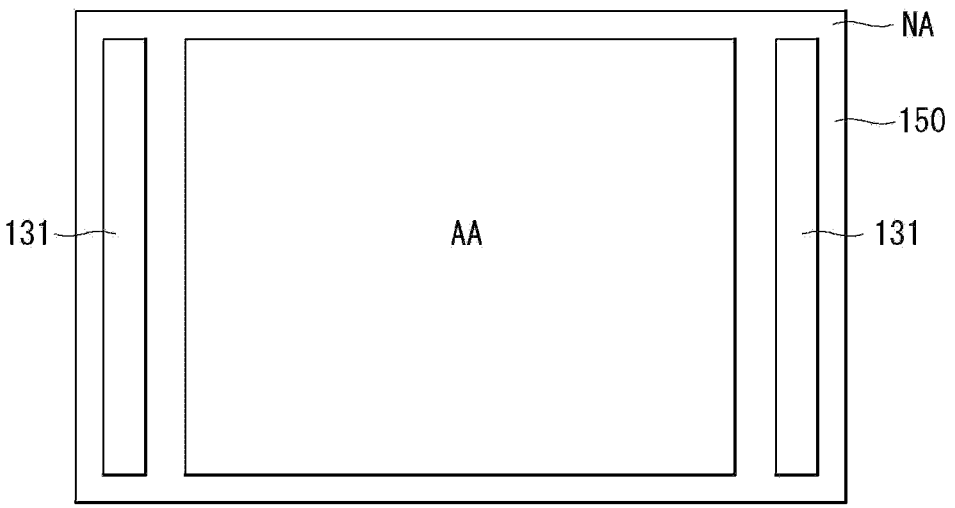
FIGS. 6A and 6B are views illustrating a disposition example of a shift resistor circuit.
Figure 6B:
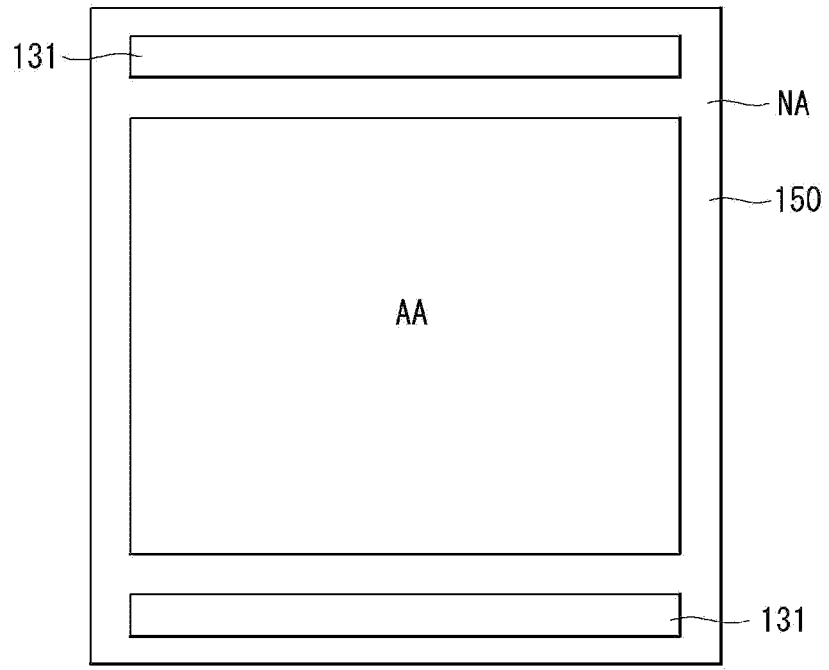

FIG. 5 is a block diagram illustrating a configuration of a device associated with a gate-in panel type scan driver. FIGS. 6A and 6B are views illustrating a disposition example of a shift resistor circuit.

As illustrated in FIGS. 5, 6A and 6B, the gate-in panel type scan driver may include a shift register circuit 131 (e.g., scan signal generator) and a level shifter 135 (e.g., clock signal and voltage generator). The level shifter 135 generates and outputs a plurality of clock signals Gclk, a start signal Gvst, etc., based on signals output from the timing controller 120.

The shift register circuit 131 operates based on the plurality of clock signals Gclk, the start signal Gvst, etc., output from the level shifter 135, and generates and outputs scan signals to be applied to the display panel 150.

As shown in FIG. 6A, the shift register circuit 131 may be disposed in left and right non-display areas NA of the display panel 150. Alternatively, as shown in FIG. 6B, the shift register circuit 131 may be disposed in upper and lower non-display areas NA of the display panel 150. Although the shift register circuit 131 is illustrated as being disposed in a pair in non-display areas NA at left and right sides or upper and lower sides of a display area AA, one shift register circuit 131 may be disposed only at one of the left, right, upper, and lower sides of the display area AA. Embodiments of the present disclosure are not limited to the above-described conditions.

Figure 7:
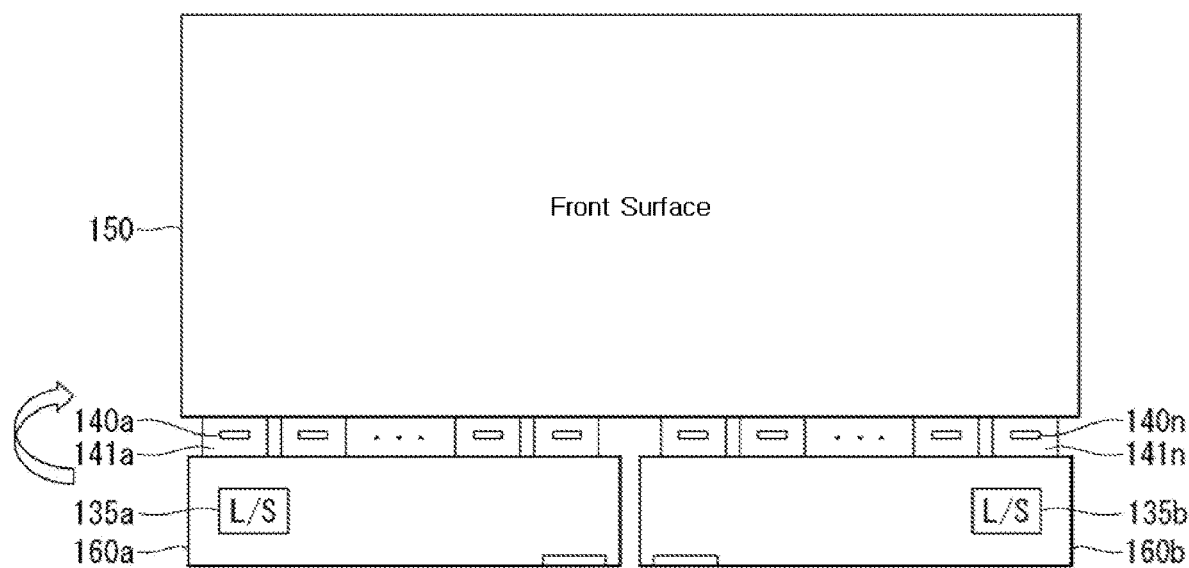
FIG. 7 is a view illustrating a modular structure of the display panel according to an embodiment of the present invention.
Figure 8A:
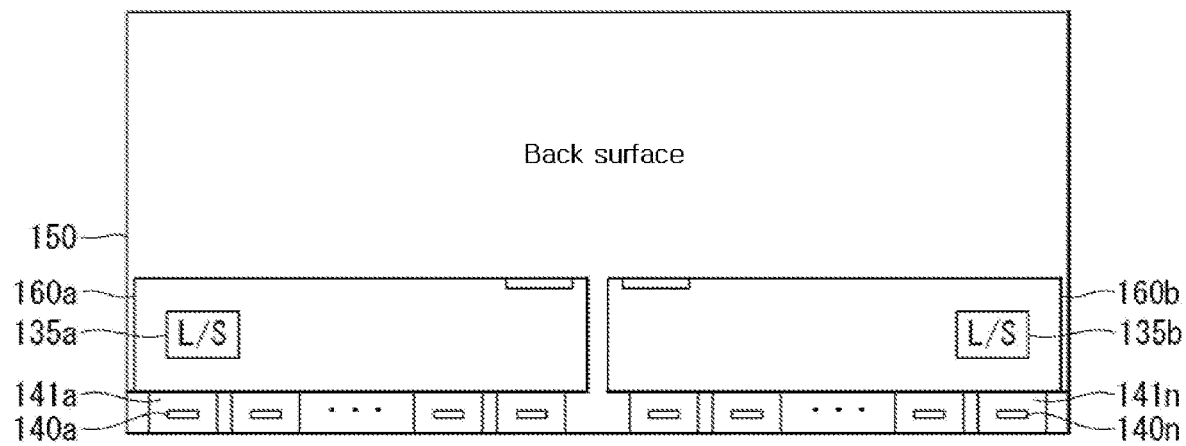
FIGS. 8A and 8B are views illustrating a back surface of the modularized display panel of FIG. 7.
Figure 8B:
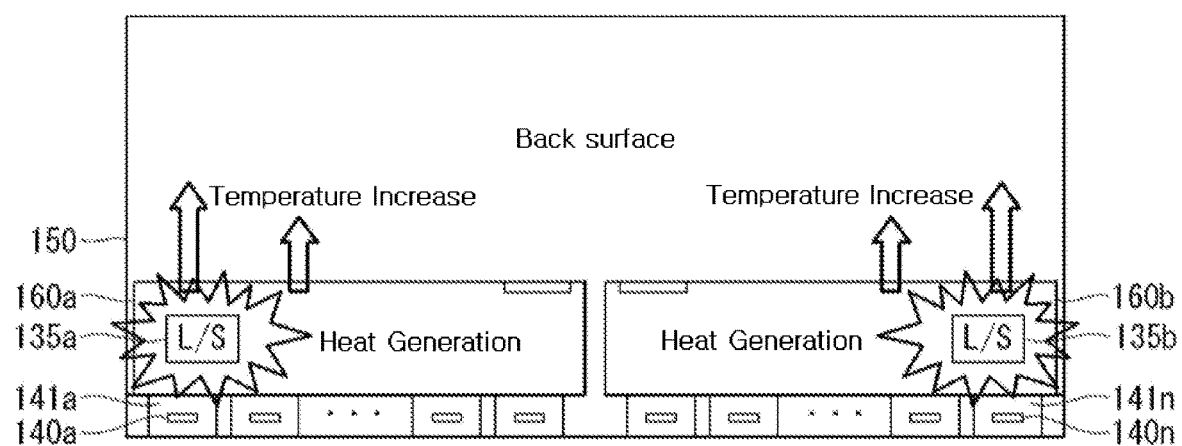

FIG. 7 is a view illustrating a modular structure of the display panel according to an embodiment of the present disclosure. FIGS. 8A and 8B are views illustrating a back surface of the modularized display panel of FIG. 7.

As illustrated in FIG. 7, a part of configurations included in the display device, for example, a display panel 150, data drivers 140a to 140n, flexible circuit boards 141a to 141n, level shifters 135a and 135b, and printed circuit boards 160a and 160b, may be modularized.

The flexible circuit boards 141a to 141n, on which the data drivers 140a to 140n are mounted, respectively, are attached to the display panel 150. The flexible circuit boards 141a to 141n are attached to associated ones of the printed circuit boards 160a and 160b on which the level shifters 135a and 135b are mounted. The flexible circuit boards 141a to 141n are electrically connected to one side of the display panel 150 and one side of the corresponding printed circuit boards 160a or 160b via an anisotropic conductive film (ACF). Meanwhile, the numbers of the data drivers 140a to 140n, the flexible circuit boards 141a to 141n, and the printed circuit boards 160a and 160b in FIG. 7 may be varied in accordance with the size or resolution of the display panel.

As illustrated in FIGS. 7, 8A and 8B, the flexible circuit boards 141a to 141n, the printed circuit boards 160a and 160b, etc., in the modularized display panel 150 may be attached to a back surface of the display panel 150. After attachment, the modularized display panel 150 may be coupled to a frame. That is, the flexible circuit boards 141a to 141n, the printed circuit boards 160a and 160b, etc., may be bent toward the back side of the display panel 150 in order to prevent formation of an unnecessary bezel when the modularized display panel 150 is coupled to the frame.

As illustrated in FIGS. 8A and 8B, when the flexible circuit boards 141a to 141n and the printed circuit boards 160a and 160b are attached to the back surface of the display panel 150, problems associated with generation of heat caused by circuits handling a high voltage, for example, the level shifters 135a and 135b, should be taken into consideration.

Accordingly, embodiments associated with the above-described conditions will be described. In connection with this description, the surfaces of the printed circuit boards before mounting of the level shifters should be viewed in a drawing. To this end, a plan view in a state after mounting of the level shifters and a plan view in a state before mounting of the level shifters are given. In addition, cross-sectional views in a mounted state of the level shifters are given for better understanding of the present disclosure.

Figure 9A:
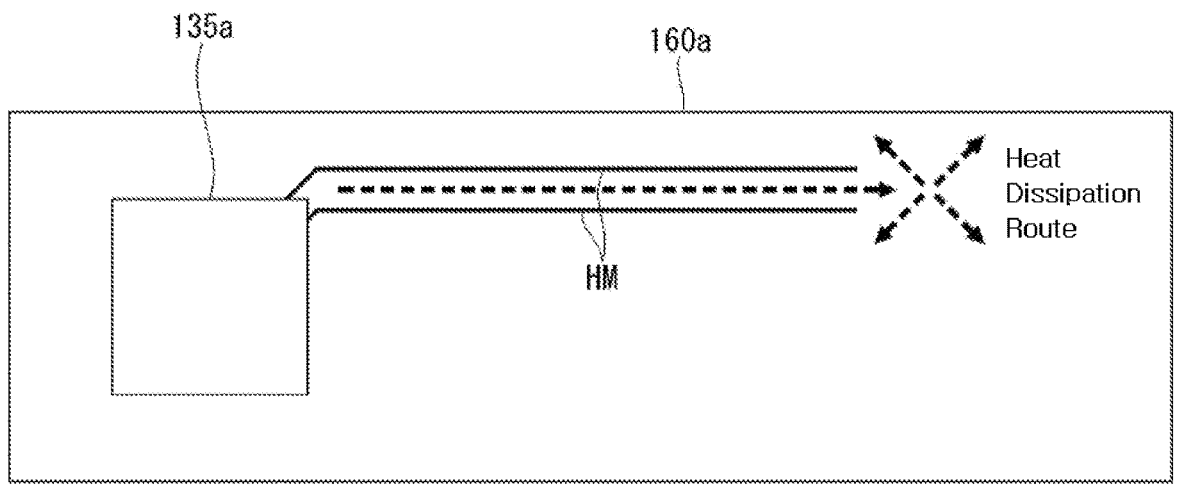
FIGS. 9A and 9B are plan views of a printed circuit board according to a first embodiment of the present invention.
Figure 9B:
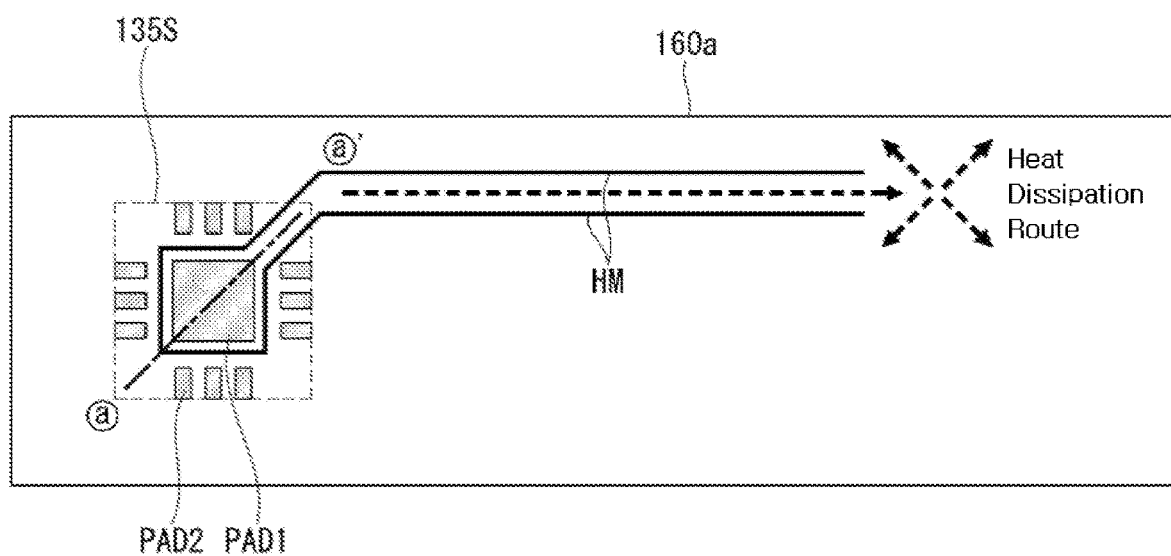
Figure 10:
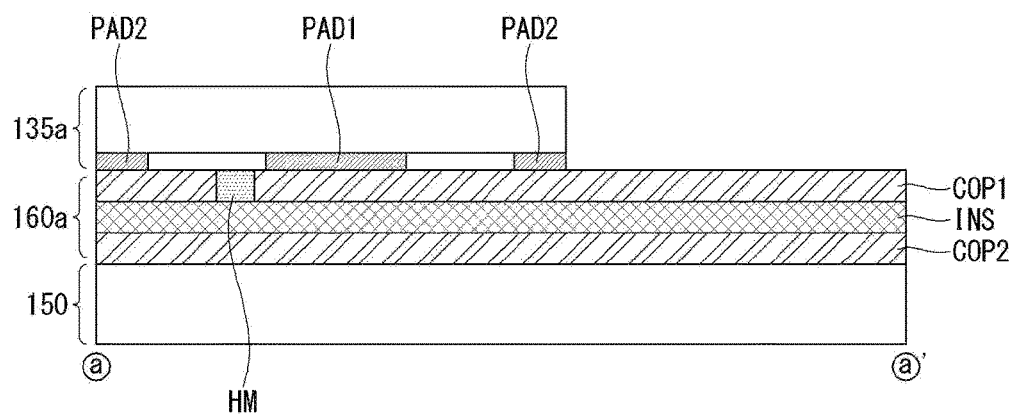
FIG. 10 is a cross-sectional view taken along line a-a' in FIG. 9B.
Figure 11:
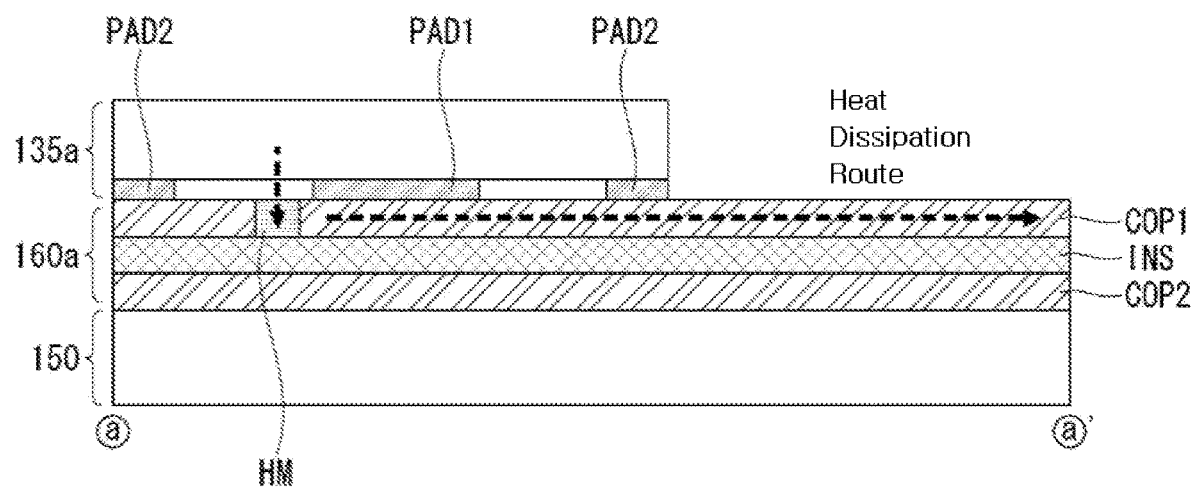
FIG. 11 is a view explaining a heat dissipation route structure according to an embodiment of the present disclosure and advantages thereof.
Figure 12:
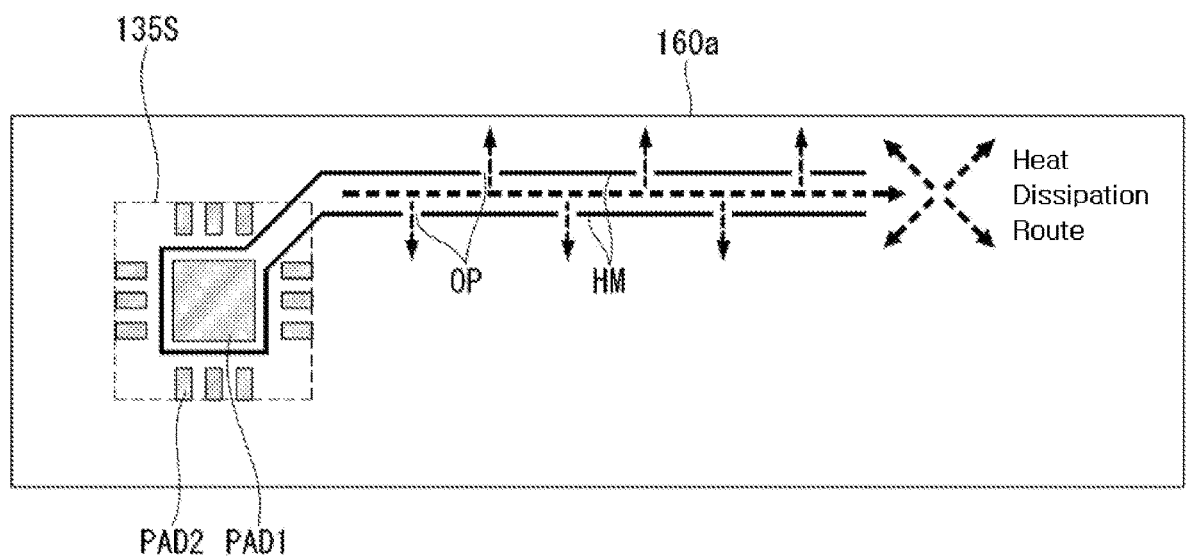
FIG. 12 is a view of a modification from the first embodiment of the present invention.

FIGS. 9A and 9B are plan views of a printed circuit board according to a first embodiment of the present disclosure. FIG. 10 is a cross-sectional view taken along line a-a' in FIG. 9B. FIG. 11 is a view explaining a heat dissipation route structure according to an embodiment of the present disclosure and advantages thereof. FIG. 12 is a view of a modification from the first embodiment of the present disclosure. It should be noted that FIG. 9A is a plan view in a state after mounting of the level shifters, whereas FIG. 9B is a plan view in a state before mounting of the level shifters.

As illustrated in FIGS. 9A and 9B, and FIG. 10, the printed circuit board 160a is in a state of being attached to the back surface of the display panel 150. The printed circuit board 160a may include an insulating layer INS, a first metal layer COP1 disposed at one surface of the insulating layer INS, and a second metal layer COP2 disposed at the other surface of the insulating layer INS. That is, the printed circuit board 160a may be selected to have a double-layer structure including the first and second metal layers COP1 and COP2.

The first metal layer COP1 of the printed circuit board 160a may include a level shifter mounting area 135S constituted by a first pad PAD1 and a second pad PAD2. The first pad PAD1 corresponds to a central area of the level shifter 135a, and the second pad PAD2 corresponds to an edge area of the level shifter 135a. In some embodiments, the first pad PAD1 may be defined as a pad for grounding or heat dissipation, and the second pad PAD2 may be defined as a pad for inputting/outputting of a voltage or a signal.

The first pad PAD1 may have a quadrangular shape having a greater area than the second pad PAD2. The second pad PAD2 may have a rectangular shape having a smaller area than the first pad PAD1. The second pad PAD2 may be disposed in plural around the first pad PAD1 while being adjacent to four sides of the first pad PAD1 in a state of being spaced apart from the first pad PAD1. The following description will be given in conjunction with the case in which a plurality of second pads PAD2 is disposed around the first pad PAD1.

The first metal layer COP1 of the printed circuit board 160a is a surface of the printed circuit board 160a on which the level shifter 135a is mounted. The second metal layer COP2 of the printed circuit board 160a is a surface of the printed circuit board 160a attached to the back surface of the display panel 150. The first metal layer COP1 of the printed circuit board 160a may include a groove HM recessed to expose a surface of the insulating layer INS in order to guide heat dissipation to specific locations relative to the level shifter 135a.

The term "groove" as used herein is sufficiently broad to cover a structure in which material has been removed from a layer and replaced with a different material that extends for some length in a linear direction that is much longer than its width or height. Among the examples provided herein is a groove HM that is formed in a layer of cooper or other metal. A strip of material is removed from this metal layer, such COP1 or COP2 and replaced with a different material, such as a thermal insulator, a void, ambient air, or other material that is different from the metal to form the groove HM.

In accordance with the first embodiment, the groove HM may be formed not only at an inner area of the level shifter mounting area 135S (an area covered by the level shifter 135a not to be exposed to an outside of the level shifter mounting area 135S), but also at an area outside the level shifter mounting area 135S (an area exposed to an outside of the level shifter mounting area 135S) in order to form a heat dissipation route extending along the four sides of the first pad PAD1 between the first pad PAD1 and the second pads PAD2 and then extending widely up to an area of the printed circuit board 160a outside the level shifter mounting area 135S.

In detail, the groove HM may include an inner portion adjacently located to the four sides of the first pad PAD1, and an outer portion extending from the inner portion in a diagonal direction such that the outer portion is exposed to the outside of the level shifter mounting area 135S. The outer portion of the groove HM exposed to the outside of the level shifter mounting area 135S may extend linearly lengthily in a longitudinal direction of the printed circuit board 160a.

The groove HM extends to be adjacent to the four sides of the first pad PAD1, and then extends along first and second lines extending in a diagonal direction and then extending linearly lengthily in the longitudinal direction of the printed circuit board 160a while being spaced apart from each other. In some embodiments, the first and second lines may be guide lines and the groove HM may be formed between and along the first and second guide lines. The groove HM has an area where the groove HM is disconnected at one side thereof (a side opposite to the level shifter mounting area 135S). Accordingly, the groove HM may have an area where, although the HM is adjacently located to the four sides of the first pad PAD1, the HM is opened at a first corner (right upper corner) of the first pad PAD1 without having a completely closed loop shape.

As illustrated in FIG. 11, the printed circuit board 160a of the first embodiment has the groove HM configured to provide a heat dissipation route capable of guiding heat generated due to operation of the level shifter 135a (heat generated at a lower side of the IC) from the inside of the level shifter mounting area 135S to the outside of the level shifter mounting area 135S. As a result, the display device including the printed circuit board 160a of the first embodiment may achieve efficient heat dissipation, even though a printed circuit board, on which a circuit such as the level shifter 135a is mounted, is attached to the back surface of the display panel 150.

Meanwhile, although the configuration, which is mounted on the printed circuit board 160a and generates heat in accordance driving thereof, is specified as the level shifter 135a in the embodiment of the present disclosure, this is only illustrative. The structure such as the groove HM may also be formed even in an area where other ICs are mounted. In addition, disposition of the pads PAD1 and PAD2 and the groove HM at the first metal layer COP1 of the printed circuit board 160a in the present disclosure is briefly illustrated. However, it should be noted that lines to be connected to the level shifter 135a, lines to be connected to an external board (for example, a system board), contact holes to connect the first metal layer COP1 and the second metal layer COP2, etc., are disposed at the first metal layer COP1 and the second metal layer COP2. In addition to pads including the first and second pads PAD1 and PAD2, the printed circuit board 160a includes pads for connecting the printed circuit board 160a to the display panel, etc.

The formation and operation of groove HM will now be explained in light of FIGS. 9B, 10 and 11 to provide one example and these applies to the other embodiments provided herein. As noted a display panel 150 may have metal layer COP2 formed thereon a selected locations. Overlying this will be an insulation layer INS at selected locations, or in some instances, in all locations except where it is removed to permit contact between COP2 and other layers. A layer COP1 is formed on the INS layer at selected locations. A vertical opening is then formed in the layer COP1 by etching, laser burning or other technique. This opening extends vertically downward through COP1 to the INS layer and extends lineally along the layer COP1 in a desired pattern. FIG. 9B shows one linear pattern in which it extends generally around the pad, leaving one open area at a corner or edge of the pad and then extends as two parallel grooves for some distance away from the pad PAD1 to provide a heat dissipation route. This open strip is then filled with a thermally insulting material, such as a standard thermal and electrical insulator used in printed circuit boards, solder resist or the like. This is formed to be flush on the top surface with the top surface of COP1, as shown in FIG. 10. The groove HM will serve to reduce or block the transfer of heat from one part of the layer COP1 to other parts of the layer COP1 that are on the other side. Areas on the other side of the groove HM will have less heat then those one the side that adjacent to the pad PAD1. The generated at pad PAD1 will therefore be guided to travel along the unblocked path of COP1 that does not contain a groove.

As illustrated in FIG. 12, the printed circuit board 160a according to the modified embodiment has the same groove HM as the first embodiment. In accordance with the modified embodiment, however, the outer portion of the groove HM exposed to the outside of the level shifter mounting area 135S may further include disconnection areas OP even though the outer portion of the groove HM extends linearly lengthily in the longitudinal direction of the printed circuit board 160a.

The disconnection areas OP of the groove HM are alternately disposed at the two lines, without being limited thereto. As passages assisting heat dispersion are provided on the heat dissipation route at intervals, an effect of achieving a further enhancement in heat dissipation performance may be expected.

In accordance with the present disclosure, it may be possible to provide various heat dissipation routes capable of externally guiding heat generated during driving of the level shifter 135a, etc., disposed on the printed circuit board 160a. Hereinafter, this will be described in detail.

Figure 13A:
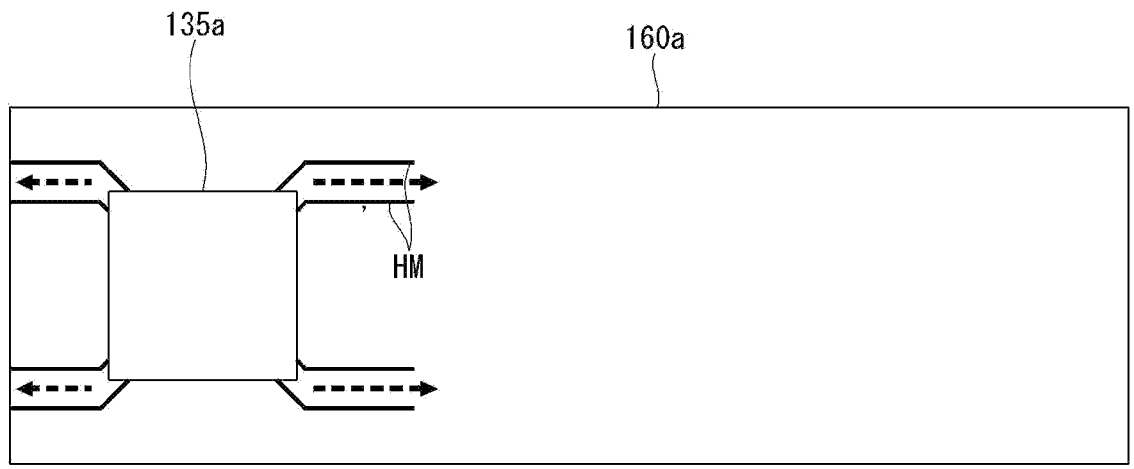
FIGS. 13A and 13B are plan views of a printed circuit board according to a second embodiment of the present invention.
Figure 13B:
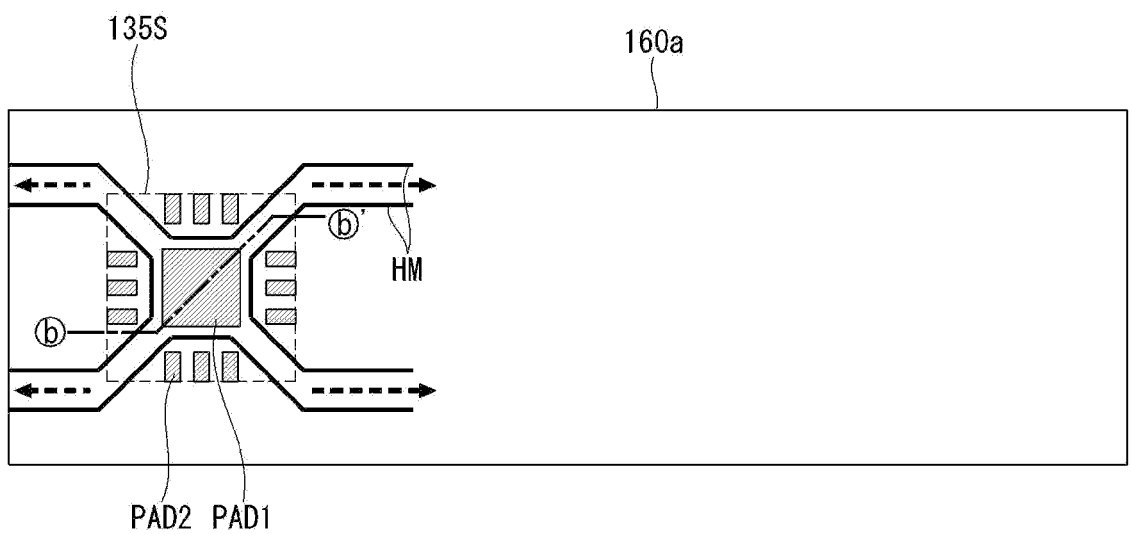
Figure 14:
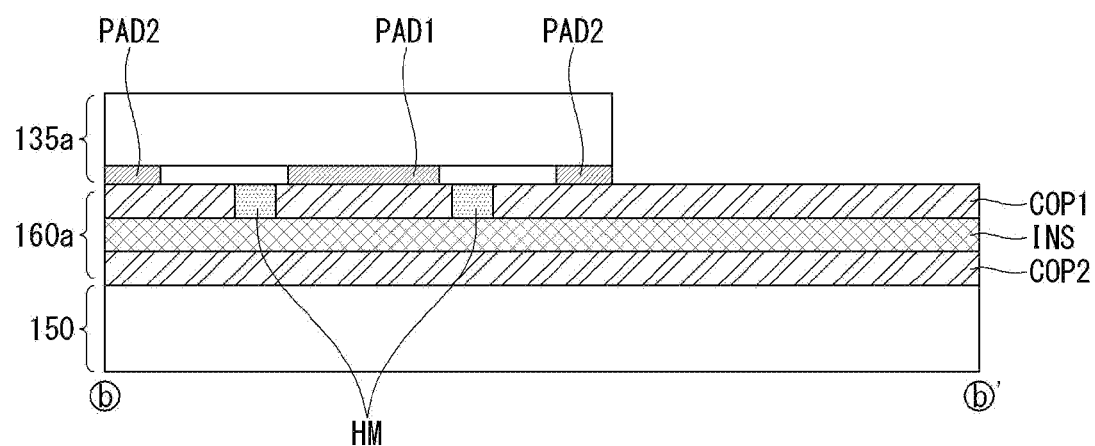
FIG. 14 is a cross-sectional view taken along line b-b' in FIG. 13B.

FIGS. 13A and 13B are plan views of a printed circuit board according to a second embodiment of the present disclosure. FIG. 14 is a cross-sectional view taken along line b-b' in FIG. 13B. It should be noted that FIG. 13A is a plan view in a state after mounting of level shifters, whereas FIG. 13B is a plan view in a state before mounting of level shifters.

As illustrated in FIGS. 13A and 13B, and FIG. 14, the printed circuit board 160a is in a state of being attached to the back surface of the display panel 150. The printed circuit board 160a may include an insulating layer INS, a first metal layer COP1 disposed at one surface of the insulating layer INS, and a second metal layer COP2 disposed at the other surface of the insulating layer INS. The first metal layer COP1 of the printed circuit board 160a may include a groove HM recessed to expose a surface of the insulating layer INS in order to assist heat dissipation of the level shifter 135a.

In accordance with the second embodiment, the groove HM may be formed not only at an inner area of the level shifter mounting area 135S (an area covered by the level shifter 135a not to be exposed to an outside of the level shifter mounting area 135S), but also at an area outside the level shifter mounting area 135S (an area exposed to an outside of the level shifter mounting area 135S) in order to form a heat dissipation route extending along the four sides of the first pad PAD1 between the first pad PAD1 and the second pads PAD2 and then extending widely up to an area of the printed circuit board 160a outside the level shifter mounting area 135S.

In detail, in some embodiments, the groove HM may include an inner portion surrounding the four sides of the first pad PAD1, and outer portions respectively extending from the inner portion in a first diagonal direction (right upward direction), a second diagonal direction (right downward direction), a third diagonal direction (left upward direction) and a fourth diagonal direction (left downward direction) such that the outer portions are exposed to the outside of the level shifter mounting area 135S. The outer portions of the groove HM exposed to the outside of the level shifter mounting area 135S may extend linearly lengthily in a longitudinal direction of the printed circuit board 160a.

The groove HM extends to surround the four sides of the first pad PAD1, and then extends along first and second lines extending from an area corresponding to each corner of the first pad PAD1 in a diagonal direction and then extending linearly lengthily in the longitudinal direction of the printed circuit board 160a while being spaced apart from each other. The groove HM has areas where the groove HM is disconnected at sides thereof opposite to the level shifter mounting area 135S, respectively. Accordingly, the groove HM may have areas where, although the HM surrounds the four sides of the first pad PAD1, the HM is opened at respective corners of the first pad PAD1 without having a completely closed loop shape.

Figure 15A:
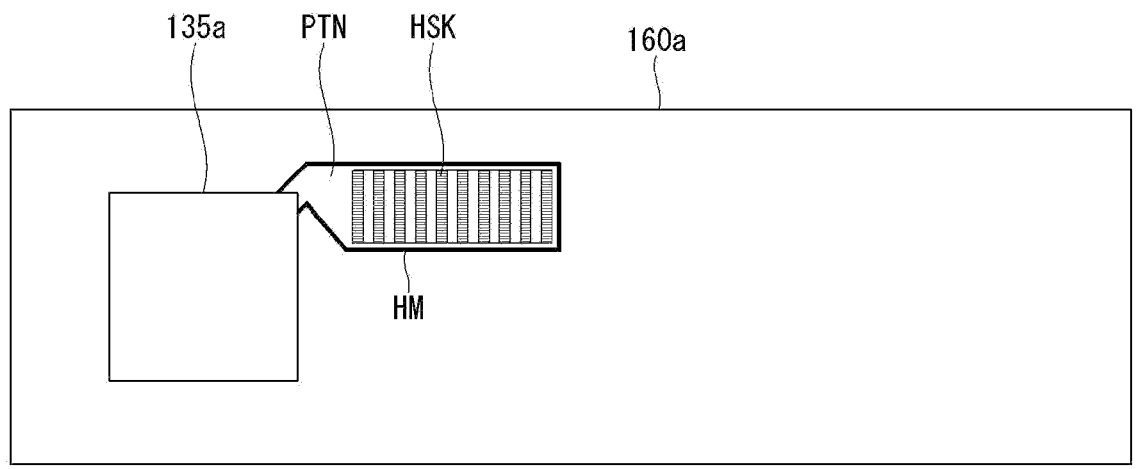
FIGS. 15A and 15B are plan views of a printed circuit board according to a third embodiment of the present invention.
Figure 15B:
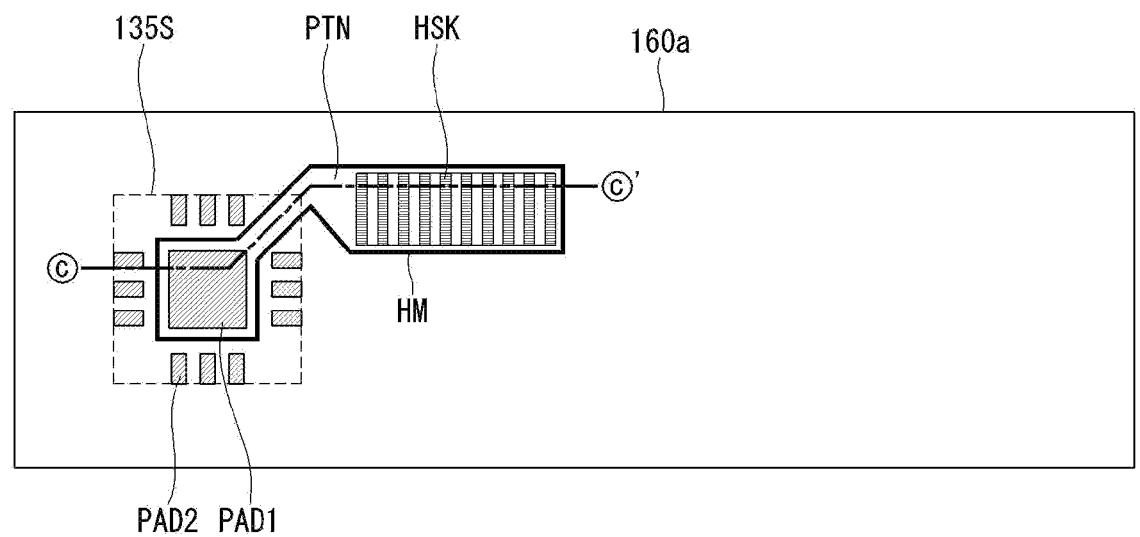
Figure 16:
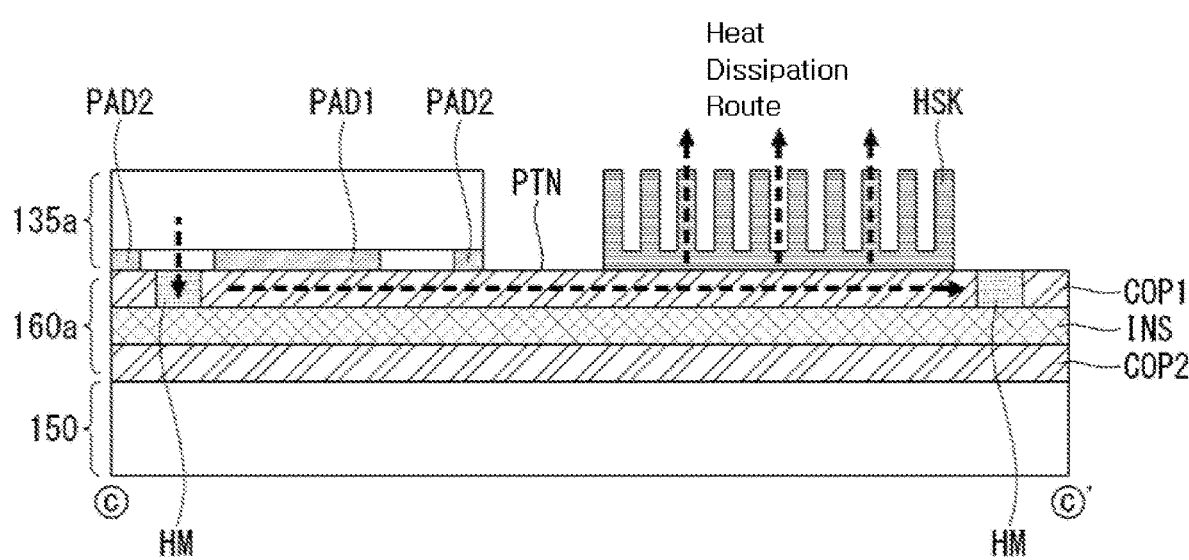
FIG. 16 is a cross-sectional view taken along line c-c' in FIG. 15B.

FIGS. 15A and 15B are plan views of a printed circuit board according to a third embodiment of the present disclosure. FIG. 16 is a cross-sectional view taken along line c-c' in FIG. 15B. It should be noted that FIG. 15A is a plan view in a state after mounting of level shifters, whereas FIG. 15B is a plan view in a state before mounting of level shifters.

As illustrated in FIGS. 15A and 15B, and FIG. 16, the printed circuit board 160a is in a state of being attached to the back surface of the display panel 150. The printed circuit board 160a may include an insulating layer INS, a first metal layer COP1 disposed at one surface of the insulating layer INS, and a second metal layer COP2 disposed at the other surface of the insulating layer INS. The first metal layer COP1 of the printed circuit board 160a may include a groove HM recessed to expose a surface of the insulating layer INS in order to assist heat dissipation of the level shifter 135a.

In accordance with the third embodiment, the groove HM may be formed not only at an inner area of the level shifter mounting area 135S (an area covered by the level shifter 135a not to be exposed to an outside of the level shifter mounting area 135S), but also at an area outside the level shifter mounting area 135S (an area exposed to an outside of the level shifter mounting area 135S) in order to form a heat dissipation route extending along the four sides of the first pad PAD1 between the first pad PAD1 and the second pads PAD2 and then extending widely up to an area of the printed circuit board 160a outside the level shifter mounting area 135S.

In detail, in some embodiments, the groove HM may include an inner portion surrounding the four sides of the first pad PAD1, and an outer portion extending from the inner portion in a diagonal direction (right upward direction) such that the outer portion is exposed to the outside of the level shifter mounting area 135S. The outer portion of the groove HM exposed to the outside of the level shifter mounting area 135S may extend linearly lengthily in a longitudinal direction of the printed circuit board 160a.

The groove HM extends to surround the four sides of the first pad PAD1, and then extends along first and second lines extending in a diagonal direction and then extending linearly lengthily in the longitudinal direction of the printed circuit board 160a while being spaced apart from each other. The groove HM has an area where the first and second lines are connected to each other after extending longitudinally. Accordingly, the groove HM may have a completely closed loop shape surrounding the four sides of the first pad PAD1 and surrounding a heat dissipation plate HSK.

A pattern PTN is disposed in an area where the groove HM extends lengthily in the longitudinal direction of the printed circuit board 160a, that is, an area exposed to the outside of the level shifter mounting area 135S. The heat dissipation plate HSK may be attached to the pattern PTN. The pattern PTN may function to assist mounting of the heat dissipation plate HSK and dissipation of heat transferred through the heat dissipation route. The heat dissipation plate HSK may function to more efficiently dissipate heat dissipated through the pattern PTN. The level of the heat dissipation plate HSK may be equal to or lower than the level of the level shifter 135a mounted on the printed circuit board 160a (to prevent the height of the heat dissipation plate HSK from influencing on the entire height of the printed circuit board 160a).

Meanwhile, although the heat dissipation plate HSK is illustrated as having a rectangular shape extending lengthily in the longitudinal direction of the printed circuit board 160a in the embodiment of the present disclosure, embodiments of the present disclosure are not limited thereto. In addition, the pattern PTN may be coated with a material assisting dissipation of heat, without being limited thereto.

Figure 17A:
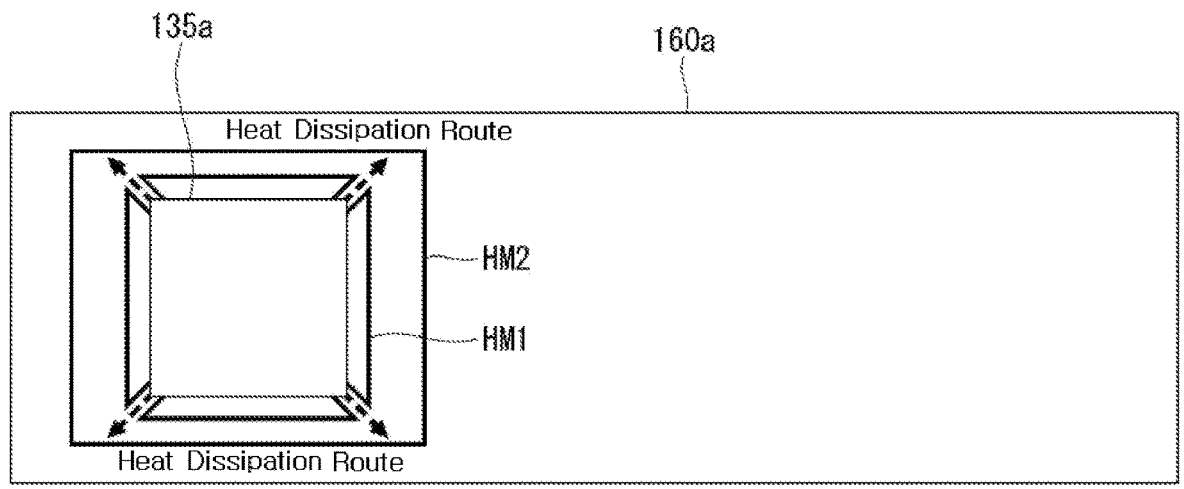
FIGS. 17A and 17B are plan views of a printed circuit board according to a fourth embodiment of the present invention.
Figure 17B:
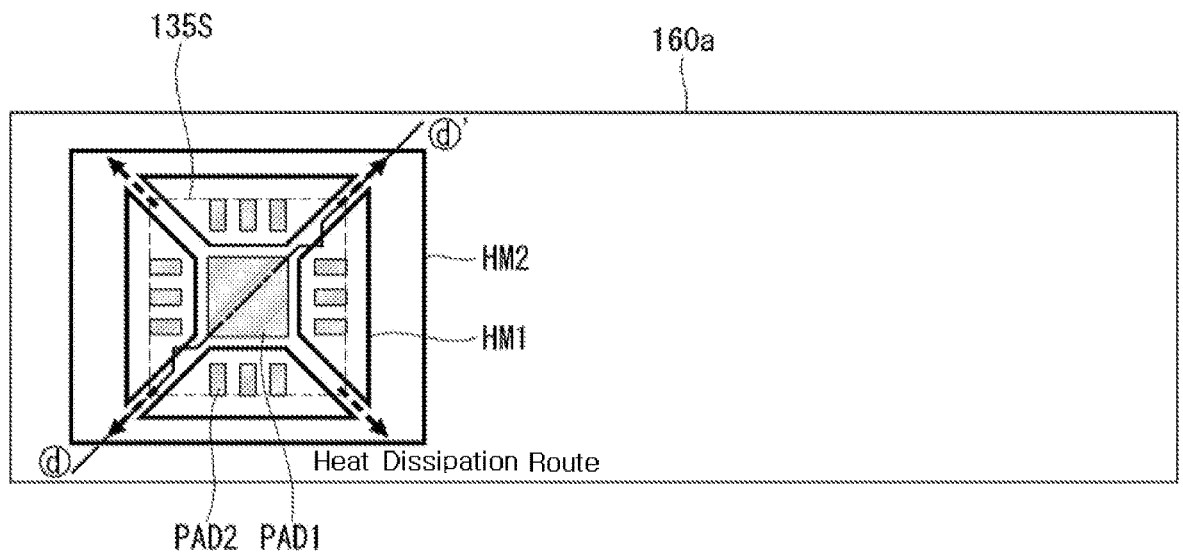
Figure 18:
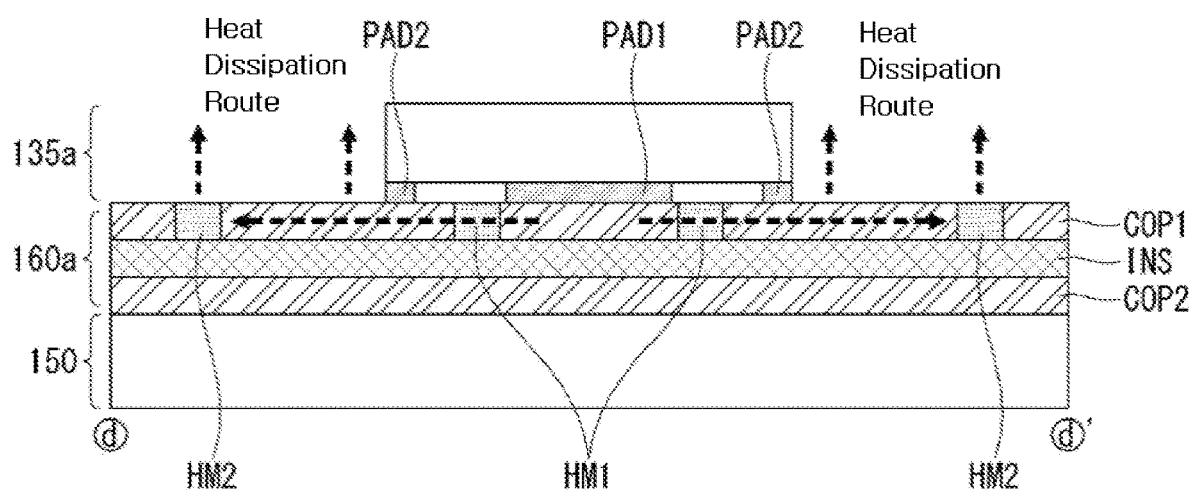
FIG. 18 is a cross-sectional view taken along line d-d' in FIG. 17B.

FIGS. 17A and 17B are plan views of a printed circuit board according to a fourth embodiment of the present disclosure. FIG. 18 is a cross-sectional view taken along line d-d' in FIG. 17B. It should be noted that FIG. 17A is a plan view in a state after mounting of level shifters, whereas FIG. 17B is a plan view in a state before mounting of level shifters.

As illustrated in FIGS. 17A and 17B, and FIG. 18, the printed circuit board 160a is in a state of being attached to the back surface of the display panel 150. The printed circuit board 160a may include an insulating layer INS, a first metal layer COP1 disposed at one surface of the insulating layer INS, and a second metal layer COP2 disposed at the other surface of the insulating layer INS. The first metal layer COP1 of the printed circuit board 160a may include a groove HM1-HM2 recessed to expose a surface of the insulating layer INS in order to assist heat dissipation of the level shifter 135a.

In accordance with the fourth embodiment, the groove HM1-HM2 may include a plurality of first grooves HM1 surrounding the second pads PAD2 disposed at the four sides of the first pad PAD1, and a second groove HM2 surrounding the plurality of first grooves HM1.

In detail, the first grooves HM1 may include a total of four grooves surrounding corresponding ones of the second pads PAD2 disposed at the four sides of the first pads PAD1, respectively, while forming a closed loop. Each of the four first grooves HM1 may have a trapezoidal shape such that a heat dissipation route opened outwards is formed at each corner of the first pad PAD1. Each of the four first grooves HM1 may include an inner portion disposed inside the level shifter mounting area 135S and an outer portion disposed outside the level shifter mounting area 135S. The second groove HM2 may have a quadrangular shape spaced apart from the four first grooves HM1 while surrounding the four first grooves HM1 at the outside of the level shifter mounting area 135S.

Each first groove HM1 may have a trapezoidal closed loop shape surrounding the corresponding second pads PAD2. The second groove HM2 may have a quadrangular closed loop shape surrounding the four first grooves HM1 at the outside of the level shifter mounting area 135S.

Although each first groove HM1 is illustrated as having a trapezoidal shape, and the second groove HM2 is illustrated as having a quadrangular shape in the embodiment, embodiments of the present disclosure are not limited thereto. In addition, a pattern coated with a material assisting dissipation of heat may be disposed between the first grooves HM1 and the second groove HM2, without being limited thereto.

Figure 19A:
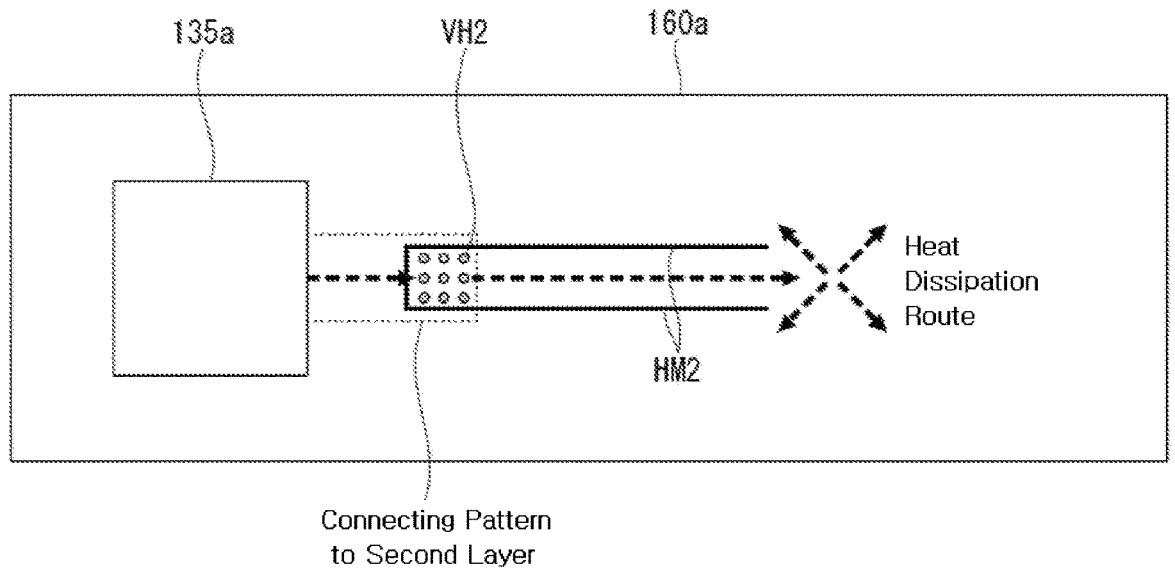
FIGS. 19A and 19B are plan views of a printed circuit board according to a fifth embodiment of the present invention.
Figure 19B:
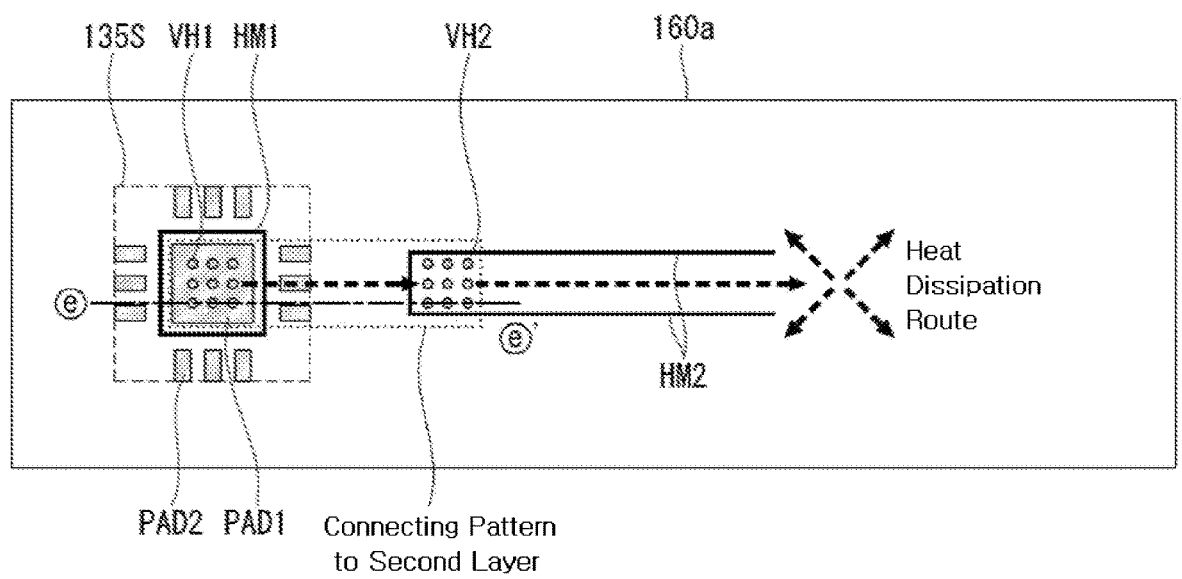
Figure 20:
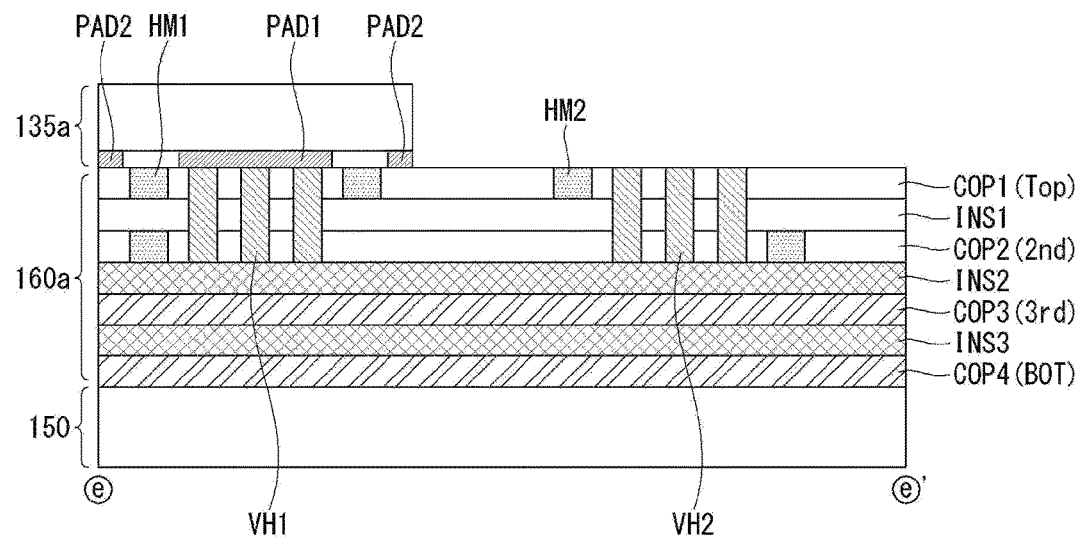
FIG. 20 is a cross-sectional view taken along line e-e' in FIG. 19B.
Figure 21:
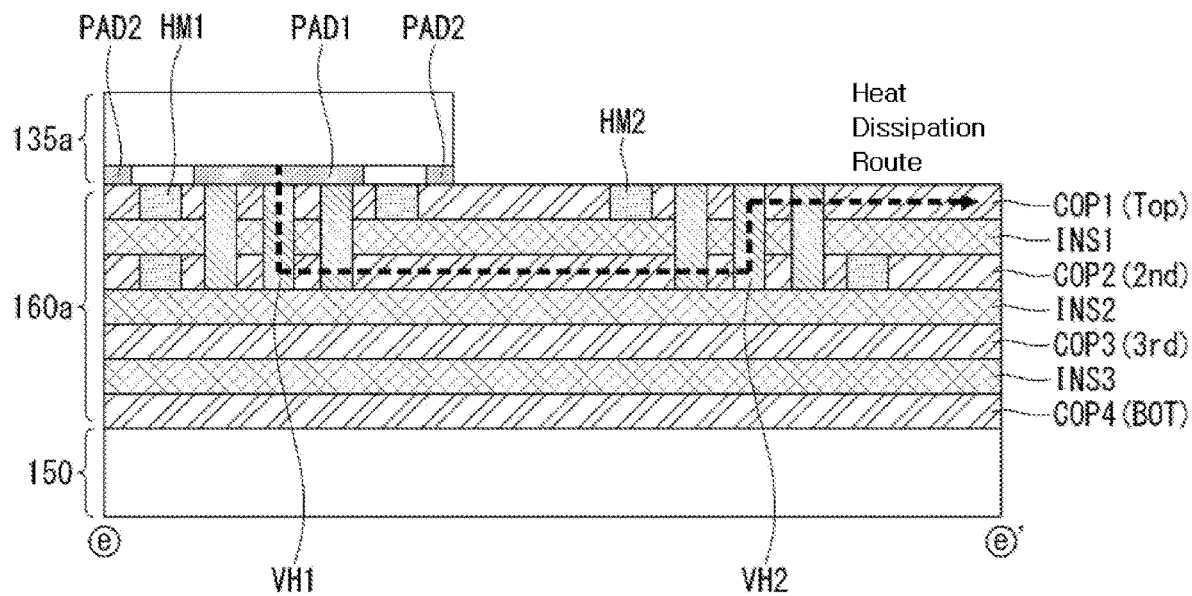
FIG. 21 is a view explaining a heat dissipation route structure shown in FIG. 19 and advantages thereof.

FIGS. 19A and 19B are plan views of a printed circuit board according to a fifth embodiment of the present disclosure. FIG. 20 is a cross-sectional view taken along line e-e' in FIG. 19B. FIG. 21 is a view explaining a heat dissipation route structure shown in FIG. 19 and advantages thereof. It should be noted that FIG. 19A is a plan view in a state after mounting of level shifters, whereas FIG. 19B is a plan view in a state before mounting of level shifters.

As illustrated in FIGS. 19A and 19B, and FIG. 20, the printed circuit board 160a is in a state of being attached to the back surface of the display panel 150. The printed circuit board 160a may include a first insulating layer INS1, a first metal layer COP1 disposed at one surface of the first insulating layer INS1, a second metal layer COP2 disposed at the other surface of the first insulating layer INS1, a second insulating layer INS2 disposed at the other surface of the second metal layer COP2, a third metal layer COP3 disposed at the other surface of the second insulating layer INS2, a third insulating layer INS3 disposed at the other surface of the third metal layer COP3, and a fourth metal layer COP4 disposed at the other surface of the third metal layer COP3. That is, the printed circuit board 160a may be selected to have a quadrant-layer structure having the first to fourth metal layers COP1 to COP4.

Each of the first and second metal layers COP1 and COP2 of the printed circuit board 160a may include a groove HM1-HM2 recessed to expose a surface of a corresponding one of the first and second insulating layers INS1 and INS2 in order to assist heat dissipation of the level shifter 135a. In addition, although the first and second metal layers COP1 and COP2 are disposed on different layers, respectively, the first and second metal layers COP1 and COP2 may include a via hole VH1-VH2 for electrically interconnecting the first and second metal layers COP1 and COP2.

In accordance with the fifth embodiment, the groove HM1-HM2 include a first groove HM1 surrounding the first pad PAD1, and a second groove HM2 disposed outside the level shifter mounting area 135S while being spaced apart from the first groove HM1. In addition, in accordance with the fifth embodiment, the via hole VH1-VH2 may include a first via hole VH1 disposed inside the first groove HM1, and a second via hole VH2 disposed inside the second groove HM2.

In detail, the first groove HM1 may be disposed between the first pad PD1 and the second pads PAD2 while having a closed loop shape surrounding the four sides of the first pad PAD1. The first groove HM1 may have a quadrangular shape, without being limited thereto. The second groove HM2 is disposed outside the level shifter mounting area 135S while being spaced apart from the first groove HM1. The second groove HM2 extends linearly lengthily in the longitudinal direction of the printed circuit board 160a. The second groove HM2 has an area where the second groove HM2 is disconnected after extending longitudinally. Accordingly, the second groove HM2 may have a U-shaped area opened at one side thereof (a side opposite to the first groove HM1).

The first via hole VH1 may be disposed inside the first groove HM1 in order to electrically connect the first and second metal layer COP1 and COP2 separated from each other in a state in which the first insulating layer INS1 is interposed between the first and second metal layers COP1 and COP2. The first pad PAD1, which has the form of an island, is electrically connected to the second metal layer COP2 by the first via hole VH1. Meanwhile, portions of the second metal layer COP2 respectively corresponding to the first via hole VH1 and the second via hole VH2 are separated from other portions of the second metal layer COP2 by the first groove HM1 and the second groove HM2 and, as such, may have a rectangular island shape. The second via hole VH2 may be disposed inside the second groove HM2 in order to electrically connect the first and second metal layers COP1 and COP2 separated from each other in a state in which the first insulating layer INS1 is interposed between the first metal layer COP1 and the second metal layer COP2. By the first and second via holes VH1 and VH2, the first and second metal layers COP1 and COP2 are electrically connected to each other, and the first and second grooves HM1 and HM2 separated from each other in the first metal layer COP1 may also be electrically connected.

In some embodiments, the groove HM formed in the second metal layer COP2 is filled with the first insulating layer INS1. Other insulating layers might be used used as well. Namely, any insulating material that is being formed after the second metal layer COP2 is form can be used to fill the opening that has been made in COP2 to obtain the finished groove HM. Other insulating layers that are available when the upper layer is formed can also be used. For the first metal layer COP1, after the opening is etched, it is filled with an available insulator, for example, solder resist (e.g., a thermal and electrical insulation material) when the solder resist is applied to the outermost layer of the printed circuit board in the further steps of circuit formation. The filling of the etched opening with the solder resist will completed the formation the groove HM. In other cases, the first metal layer COP1 is not filled any materials and it may be left open (e.g., it is left as an empty space that might be a void or ambient air).

In one or more embodiments, the material of the first metal layer COP1, the second metal layer COP2, the third metal layer COP3, and the fourth metal layer COP4 includes copper. However, other metals that have good thermal conductivity may be also utilized.

Since metals are very good heat conductors, heat is carried along the metal conductor to remove it from the pad and distribute it to locations spaced from the pad to reduce the heat buildup immediately around the pad and the structures adjacent to the pads. One role of the groove HM is to limit the heat conduction to the immediate area right next to the pad by providing breaks or thermal barriers at selected locations in the conductive layer or by separating the conductors (e.g., first metal layer COP1, the second metal layer COP2, the third metal layer COP3, and the fourth metal layer COP4). Therefore, even if the groove HM is an empty space exposed to ambient air, the insulation effect will be sufficient to assist in blocking the heat from going to some locations and guiding the heat to be dissipated to other locations, spaced from the pad.

Meanwhile, although the first groove HM1 is illustrated as having a quadrangular shape, and the second groove HM2 is illustrated as having a rectangular shape opened at one side thereof in the embodiment, embodiments of the present disclosure are not limited thereto. In addition, although the first and second via holes VH1 and VH2 are illustrated as being included only in the first and second metal layers COP1 and COP2, embodiments of the present disclosure are not limited thereto.

As illustrated in FIG. 21, the printed circuit board 160a of the fifth embodiment has the grooves HM1 and HM2 and the via holes VH1 and VH2 configured to provide a heat dissipation route capable of guiding heat generated due to operation of the level shifter 135a from the inside of the level shifter mounting area 135S to the outside of the level shifter mounting area 135S. As a result, the display device including the printed circuit board 160a of the fifth embodiment of the present disclosure may achieve efficient heat dissipation even though a printed circuit board, on which a circuit such as the level shifter 135a is mounted, is attached to the back surface of the display panel 150. In addition, since the printed circuit board 160a is configured to have a multilayer structure having four layers or more, and a heat dissipation route is formed through two of the multiple layers spaced apart from the display panel 150 by a maximum distance, it may be possible to alleviate influence of heat generated from the level shifter 135a on the display panel 150.

Meanwhile, although the configuration, which is mounted on the printed circuit board 160a and generates heat in accordance with driving thereof, is specified as the level shifter 135a in the embodiment of the present disclosure, this is only illustrative. Structures such as the grooves HM1 and HM2 and the via holes VH1 and VH2 may also be formed even in an area where other ICs are mounted.

As apparent from the above description, the present disclosure may provide a printed circuit board capable of dispersing and guiding heat generated from an IC to an outside or surroundings of the IC by providing a heat dissipation route assisting in dispersing the heat to several areas without local concentration thereof (guiding heat generated from the IC to an area spaced apart from the IC by a certain distance or more). In addition, the present disclosure may achieve an enhancement in driving stability of a driving device or an OLED device and an enhancement in display quality through prevention of a phenomenon in which heat is concentrated in an IC mounting area of the printed circuit board.

It will be apparent to those skilled in the art that various modifications and variations can be made in the present disclosure without departing from the spirit or scope of the disclosure. Thus, it is intended that the present disclosure cover the modifications and variations of this disclosure provided they come within the scope of the appended claims and their equivalents.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device, comprising:
a display panel configured to display an image having a front surface and a back surface opposite the front surface; and
a printed circuit board electrically connected to the display panel and disposed at the back surface of the display panel,
wherein the printed circuit board includes:
an electrically insulating layer,
a first metal layer disposed at one surface of the insulating layer,
a mounting area adjacent to the first metal layer, the mounting area configured to have thereon an integrated circuit,
pads including a first pad disposed on the first metal layer and disposed within the mounting area, and second pads disposed adjacent to the first pad, and
a groove filled with thermally insulating material that extends though the first metal layer in a vertical direction and linearly from an inside of the mounting area to an outside of the mounting area.

2. The display device according to claim 1, wherein the groove is adjacent to four sides of the first pad, and the groove extends from a corner portion of the first pad to the outside of the mounting area along at least two guide lines spaced apart from each other.

3. The display device according to claim 2, wherein the groove formed based on the at least two guide lines include at least one area where the groove is disconnected at the outside of the mounting area after extending linearly along the at least two guide lines in a longitudinal direction of the printed circuit board.

4. The display device according to claim 3, further comprising:
a heat dissipation plate disposed on the first metal layer, wherein the heat dissipation plate is disposed in a space provided by the at least two guide lines.

5. The display device according to claim 2, wherein the at least two lines meet with each other at the outside of the mounting area after extending in a longitudinal direction of the printed circuit board.

6. The display device according to claim 1, wherein the groove includes:
a plurality of first grooves respectively located adjacent to corresponding ones of the second pads disposed at four sides of the first pad; and
a second groove adjacent to the plurality of first grooves at the outside of the mounting area.

7. The display device according to claim 6, wherein the a plurality of first grooves respectively surrounding corresponding ones of the second pads disposed at four sides of the first pad; and
a second groove surrounding the plurality of first grooves at the outside of the mounting area.

8. The display device according to claim 1, wherein:
the groove includes a first groove surrounding four sides of the first pad, and a second groove disposed outside the mounting area;
the printed circuit board further includes a second metal layer disposed at the other surface of the insulating layer and separated in the form of islands corresponding to respective positions of the first and second grooves; and
the first groove and the second groove include a first via hole and a second via hole, respectively, to electrically connect the first metal layer and the second metal layer.

9. The display device according to claim 8, wherein the second groove has a U shape opened at a side thereof opposite to the first groove.

10. A printed circuit board, comprising:
an insulating layer;
a first metal layer disposed at one surface of the insulating layer;
a mounting area adjacent to the first metal layer, the mounting area configured to have thereon an integrated circuit,
pads including a first pad disposed on the first metal layer and disposed within the mounting area, and second pads disposed adjacent to the first pad, and
a groove provided to extend from an inside of the mounting area to an outside of the mounting area,
wherein the groove is adjacent to four sides of the first pad, and the groove extends from a corner portion of the first pad to the outside of the mounting area along at least two lines spaced apart from each other.

11. The printed circuit board according to claim 10, wherein the groove formed based on the at least two lines include at least one area where the groove is disconnected at the outside of the mounting area after extending linearly along the at least two lines in a longitudinal direction of the printed circuit board.

12. The printed circuit board according to claim 11, further comprising:

a heat dissipation plate disposed on the first metal layer, wherein the heat dissipation plate is disposed in a space provided by the at least two lines.

13. The printed circuit board according to claim 10, wherein the at least two lines meet with each other at the outside of the mounting area after extending in a longitudinal direction of the printed circuit board.

14. A printed circuit board, comprising:

an insulating layer;

a first metal layer disposed at one surface of the insulating layer;

a mounting area adjacent to the first metal layer, the mounting area configured to have thereon an integrated circuit, pads including a first pad disposed on the first metal layer and disposed within the mounting area, and second pads disposed adjacent to the first pad, and a groove provided to extend from an inside of the mounting area to an outside of the mounting area, wherein the groove includes:

a plurality of first grooves respectively located adjacent to corresponding ones of the second pads disposed at four sides of the first pad; and a second groove adjacent to the plurality of first grooves at the outside of the mounting area.

15. The printed circuit board according to claim 14, wherein the plurality of first grooves respectively surrounding corresponding ones of the second pads disposed at four sides of the first pad; and a second groove surrounding the plurality of first grooves at the outside of the mounting area.

16. A printed circuit board, comprising:

an insulating layer;

a first metal layer disposed at one surface of the insulating layer;

a mounting area adjacent to the first metal layer, the mounting area configured to have thereon an integrated circuit, pads including a first pad disposed on the first metal layer and disposed within the mounting area, and second pads disposed adjacent to the first pad, and a groove provided to extend from an inside of the mounting area to an outside of the mounting area, wherein:

the groove includes a first groove surrounding four sides of the first pad, and a second groove disposed outside the mounting area;

the printed circuit board further includes a second metal layer disposed at the other surface of the insulating layer and separated in the form of islands corresponding to respective positions of the first and second grooves; and the first groove and the second groove include a first via hole and a second via hole, respectively, to electrically connect the first metal layer and the second metal layer.

* * * * *